US008488379B2

(12) United States Patent
Scade et al.

(10) Patent No.: US 8,488,379 B2
(45) Date of Patent: Jul. 16, 2013

(54) 5T HIGH DENSITY NVDRAM CELL

(75) Inventors: Andreas Scade, Dresden (DE); Stefan Guenther, Dresden (DE)

(73) Assignee: Cypress Semiconductor Corporation, San Jose, CA (US)

( * ) Notice: Subject to any disclaimer, the term of this patent is extended or adjusted under 35 U.S.C. 154(b) by 104 days.

(21) Appl. No.: 13/270,995

(22) Filed: Oct. 11, 2011

(65) Prior Publication Data

US 2012/0113718 A1    May 10, 2012

Related U.S. Application Data

(63) Continuation of application No. 12/006,270, filed on Dec. 31, 2007, now Pat. No. 8,036,032.

(51) Int. Cl.
*G11C 14/00* (2006.01)
(52) U.S. Cl.
USPC .............. 365/185.08; 365/185.25; 365/189.2
(58) Field of Classification Search
None
See application file for complete search history.

(56) References Cited

U.S. PATENT DOCUMENTS

| | | | |
|---|---|---|---|
| 3,636,530 A | 1/1972 | Mark et al. | |
| 3,676,717 A | 7/1972 | Lockwood | |
| 3,811,076 A | 5/1974 | Smith | |
| 3,846,768 A | 11/1974 | Krick | |
| 3,950,737 A | 4/1976 | Uchida et al. | |
| 4,044,343 A | 8/1977 | Uchida | |
| 4,103,344 A | 7/1978 | Fagan et al. | |
| 4,103,348 A | 7/1978 | Fagan | |
| 4,112,507 A | 9/1978 | White et al. | |
| 4,128,773 A | 12/1978 | Troutman et al. | |
| 4,132,904 A | 1/1979 | Harari | |
| 4,138,737 A | 2/1979 | McCann | |
| 4,271,487 A | 6/1981 | Craycraft et al. | |
| 4,342,101 A | 7/1982 | Edwards | |
| 4,354,255 A | 10/1982 | Stewart | |
| 4,449,205 A | 5/1984 | Hoffman | |
| 4,467,451 A * | 8/1984 | Moyer ..................... | 365/185.07 |
| 4,545,035 A * | 10/1985 | Guterman et al. ....... | 365/185.08 |
| 4,611,309 A | 9/1986 | Chuang et al. | |
| 4,701,858 A | 10/1987 | Stokes et al. | |
| 4,769,787 A | 9/1988 | Furusawa et al. | |
| 4,799,194 A | 1/1989 | Arakawa | |
| 4,800,533 A | 1/1989 | Arakawa | |
| 4,858,185 A | 8/1989 | Kowshik et al. | |
| 4,931,997 A | 6/1990 | Mitsuishi et al. | |
| 5,043,946 A | 8/1991 | Yamauchi et al. | |

(Continued)

FOREIGN PATENT DOCUMENTS

| | | |
|---|---|---|
| JP | 60136994 A | 7/1985 |
| WO | WO9530244 A1 | 11/1995 |
| WO | WO9715929 A1 | 5/1997 |

OTHER PUBLICATIONS

"nvSRAM Basics," Simtek 1999 Data Book, Chapter 8, 8-1 through 8-5; 5 pages.

(Continued)

*Primary Examiner* — Tan T. Nguyen

(57) ABSTRACT

A memory circuit includes a high voltage region providing storage of a nonvolatile bit, and a low voltage region providing at least partial storage of a volatile bit. The high and low voltage regions are isolated from one another and formed by a plurality of transistors in series between a current source and a bit line.

20 Claims, 10 Drawing Sheets

U.S. PATENT DOCUMENTS

| | | | |
|---|---|---|---|
| 5,065,362 A | 11/1991 | Herdt et al. | |
| 5,111,257 A | 5/1992 | Andoh et al. | |
| 5,140,551 A | 8/1992 | Chiu | |
| 5,168,334 A | 12/1992 | Mitchell et al. | |
| 5,189,641 A | 2/1993 | Arakawa | |
| 5,262,986 A | 11/1993 | Yamauchi | |
| 5,283,764 A | 2/1994 | Kim et al. | |
| 5,287,319 A | 2/1994 | Fukumoto | |
| 5,353,248 A | 10/1994 | Gupta | |
| 5,387,534 A | 2/1995 | Prall | |
| 5,424,569 A | 6/1995 | Prall | |
| 5,426,605 A | 6/1995 | Van Berkel et al. | |
| 5,436,480 A | 7/1995 | Yu | |
| 5,440,508 A | 8/1995 | Pathak et al. | |
| 5,467,300 A | 11/1995 | Komarek et al. | |
| 5,485,429 A | 1/1996 | Ono | |
| 5,488,579 A | 1/1996 | Sharma et al. | |
| 5,496,756 A | 3/1996 | Sharma et al. | |
| 5,506,816 A | 4/1996 | Hirose et al. | |
| 5,510,638 A | 4/1996 | Lancaster et al. | |
| 5,511,020 A | 4/1996 | Hu et al. | |
| 5,602,776 A | 2/1997 | Herdt et al. | |
| 5,617,357 A | 4/1997 | Haddad et al. | |
| 5,638,323 A | 6/1997 | Itano | |
| 5,644,533 A | 7/1997 | Lancaster et al. | |
| 5,656,837 A | 8/1997 | Lancaster et al. | |
| 5,760,644 A | 6/1998 | Lancaster et al. | |
| 5,768,208 A | 6/1998 | Bruwer et al. | |
| 5,774,400 A | 6/1998 | Lancaster et al. | |
| 5,789,776 A | 8/1998 | Lancaster et al. | |
| 5,864,499 A | 1/1999 | Rohparvar et al. | |
| 5,892,712 A | 4/1999 | Hirose et al. | |
| 6,026,018 A | 2/2000 | Herdt et al. | |
| 6,122,191 A | 9/2000 | Hirose et al. | |
| 6,141,248 A | 10/2000 | Forbes et al. | |
| 6,172,907 B1 | 1/2001 | Jenne | |
| 6,222,765 B1 | 4/2001 | Nojima | |
| 6,285,586 B1 | 9/2001 | Lung et al. | |
| 6,414,873 B1 | 7/2002 | Herdt | |
| 6,469,930 B1 * | 10/2002 | Murray | 365/185.08 |
| 6,532,169 B1 | 3/2003 | Mann et al. | |
| 6,556,487 B1 | 4/2003 | Ratnakumar et al. | |
| 6,674,665 B1 | 1/2004 | Mann et al. | |
| 6,952,366 B2 * | 10/2005 | Forbes | 365/185.08 |
| 7,663,917 B2 * | 2/2010 | Cuppens et al. | 365/185.08 |
| 2004/0145024 A1 | 7/2004 | Chen et al. | |
| 2006/0023503 A1 | 2/2006 | Lee | |

OTHER PUBLICATIONS

Herdt et al., "Analysis, Measurement, and Simulation of Dynamic Write Inhibit in a nvSRAM Cell," 1992, IEEE: 6 pages.

International Search Report of the International Searching Authority, dated Feb. 18, 2009 for International Application No. PCT/US08/87795; 2 pages.

International Written Opinion of the International Searching Authority, dated Feb. 18, 2009 for International Application No. PCT/US08/87795; 5 pages.

Lundstrom et al., "Properties of MNOS Structures," Jun. 1972, IEEE Transactions on Electron Devices, vol. Ed-19, No. 6; 11 pages.

Svensson et al., "Trap-Assisted Charge Injection in MNOS Structures," Journal of Applied Physics, vol. 44, No, 10, Oct. 1973, pp. 4657-4663; 7 pages.

Takahashi et al., "Estimation of Insulation Layer Conductrance in MNOS Structure," Nov. 1993, IEEE Transactions on Electron Devices, vol. 40, No. 11; 5 pages.

USPTO Final Rejection for U.S. Appl. No. 07/361,033 dated Jan. 18, 1991; 5 pages.

USPTO Final Rejection for U.S. Appl. No. 08/234,288 dated May 31, 1995; 3 pages.

USPTO Non Final Rejection for U.S. Appl. No. 12/006,270 dated Apr. 13, 2010; 5 pages.

USPTO Non Final Rejection for U.S. Appl. No. 12/006,270 dated Aug. 24, 2009; 13 pages.

USPTO Non-Final Rejection for U.S. Appl. No. 07/361,033 dated Jun. 12, 1990; 11 pages.

USPTO Non-Final Rejection for U.S. Appl. No. 08/234,288 dated Oct. 6, 1994; 2 pages.

USPTO Non-Final Rejection for U.S. Appl. No. 08/549,483 dated May 29, 1996; 5 pages.

USPTO Non-Final Rejection for U.S. Appl. No. 09/136,694 dated Nov. 12, 1999; 8 pages.

USPTO Non-Final Rejection for U.S. Appl. No. 09/137,914 dated Jun. 9, 1999; 4 pages.

USPTO Non-Final Rejection for U.S. Appl. No. 09/426,100 dated Mar. 10, 2000; 7 pages.

USPTO Non-Final Rejection for U.S. Appl. No. 09/626,267 dated Mar. 28, 2001; 5 pages.

USPTO Non-Final Rejection for U.S. Appl. No. 09/681,317 dated Jul. 24, 2001; 9 pages.

USPTO Non-Final Rejection for U.S. Appl. No. 09/871,172 dated Jul. 22, 2002; 6 pages.

USPTO Non-Final Rejection for U.S. Appl. No. 09/892,164 dated Jun. 27, 2002; 6 pages.

USPTO Non-Final Rejection for U.S. Appl. No. 10/368,528 dated May 20, 2003; 8 pages.

USPTO Non-Final Rejection for U.S. Appl. No. 12/006,270 dated Feb. 3, 2011; 5 pages.

USPTO Notice of Allowance for U.S. Appl. No. 07/361,033 dated Apr. 30, 1991; 3 pages.

USPTO Notice of Allowance for U.S. Appl. No. 08/234,288 dated Oct. 2, 1995; 1 page.

USPTO Notice of Allowance for U.S. Appl. No. 08/549,483 dated Aug. 8, 1996; 3 pages.

USPTO Notice of Allowance for U.S. Appl. No. 08/715,569 dated Aug. 19, 1997; 1 page.

USPTO Notice of Allowance for U.S. Appl. No. 08/735,973 dated Nov. 21, 1997; 3 pages.

USPTO Notice of Allowance for U.S. Appl. No. 08/846,558 dated Jul. 20, 1998; 3 pages.

USPTO Notice of Allowance for U.S. Appl. No. 09/136,694 dated Apr. 24, 2000; 4 pages.

USPTO Notice of Allowance for U.S. Appl. No. 09/137,914 dated Oct. 29, 1999; 1 page.

USPTO Notice of Allowance for U.S. Appl. No. 09/426,100 dated Jul. 19, 2000; 4 pages.

USPTO Notice of Allowance for U.S. Appl. No. 09/626,267 dated Aug. 7, 2001: 5 pages.

USPTO Notice of Allowance for U.S. Appl. No. 09/681,317 dated Mar. 13, 2002: 4 pages.

USPTO Notice of Allowance for U.S. Appl. No. 09/871,172 dated Dec. 13, 2002; 4 pages.

USPTO Notice of Allowance for U.S. Appl. No. 09/892,164 dated Oct. 17, 2002; 4 pages.

USPTO Notice of Allowance for U.S. Appl. No. 10/368,528 dated Aug. 21, 2003; 4 pages.

USPTO Notice of Allowance for U.S. Appl. No. 12/006,270 dated Jun. 9, 2011; 7 pages.

USPTO Notice of Allowance for U.S. Appl. No. 12/006,270 dated Aug. 6, 2010; 6 pages.

USPTO Notice of Allowance for U.S. Appl. No. 12/006,270 dated Dec. 18, 2009; 6 pages.

USPTO Requirement for Restriction/Election for U.S. Appl. No. 09/626,267 dated Dec. 1, 2000; 4 pages.

* cited by examiner

US 8,488,379 B2

5T HIGH DENSITY NVDRAM CELL

RELATED APPLICATIONS

This application Ser. No. (13/270,995) claims priority under 35 U.S.C. 120 as a continuation of USA application Ser. No. 12/006,270 filed on Dec. 31, 2007, now U.S. Pat. No. 8,036,032, which is incorporated herein by reference in its entirety.

TECHNICAL FIELD

The present disclosure relates to memory circuits.

BACKGROUND

High speed volatile and non-volatile storage of data is an important feature in computer systems. Present solutions use specialized volatile memory technologies, like DRAM and SRAM with non volatile back up memories, such as BBSRAM, EEPROM and FLASH. In case of power loss significant amounts of volatile data may have to be stored in the non-volatile memory. This is typically done via signaling interfaces between volatile and nonvolatile memory regions, the interfaces having limited parallelism, high current requirements, and possibly using multiple processor cycles to manage the data transfer. A faster and less power intensive solution is nvSRAM memories, where each volatile cell is paired with a non-volatile cell and data may pass from one region to another without first being placed on a bus or other signaling interface. One disadvantage of present nvSRAM circuits is their limited density and relatively large memory cell size, typically involving 12 high and low voltage transistor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Figure 1:
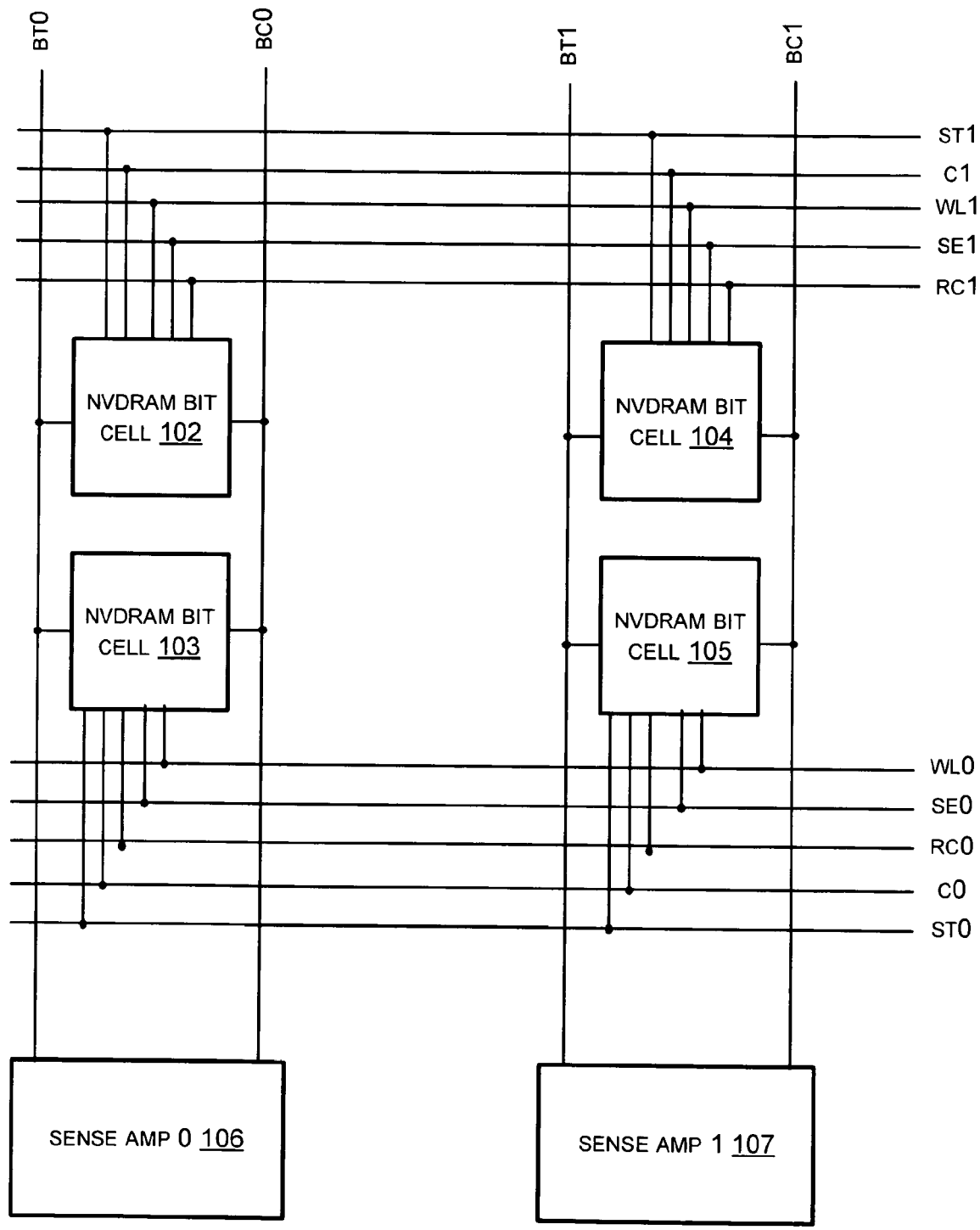
FIG. 1 is a block diagram of an embodiment of a memory system including combined volatile nonvolatile bit cells.

FIG. 1 is a block diagram of an embodiment of a memory system including combined volatile nonvolatile bit cells. The system, which may be arranged as an array of cells, comprises bit cells 102-105. The array comprises sense amplifiers 106 and 107. Data is presented to and retrieved from cells 102-105 using bit lines BT0 and BT1, and compliment bit lines BC0 and BC1. Signal paths SE0 and SE1 are used for ERASE and STORE operations on nonvolatile memory. Signal paths RC0 and RC1 are also used for operations on nonvolatile memory, RECALL in particular. The word lines WL0 and WL1 are activated for both volatile and nonvolatile operations, to couple internal structures of the cells 102-105 with the bit lines and their complement lines. Signal paths C0, C1, ST0 and ST1 may be used in various ways, depending upon the implementation. Some examples are provided in the description below.

Each memory cell 102-105 acts to store a volatile and non-volatile memory bit. Additionally, each memory bit cell 102-105 acts to store a compliment to the volatile and non-volatile memory bits. During some operations, such as READ, WRITE, and STORE, the sense amplifiers 106 and 107 may react to differential voltages on the bit lines BTx and complement bit lines BCx to drive the bit line voltage levels to unambiguous logical zeros and ones. During other operations, such as RECALL, the sense amplifiers 106 and 107 may react to current flows on the bit lines BTx and complement bit lines BCx to drive the bit line voltage levels to unambiguous logical zeros and ones.

The array provides both volatile and non-volatile memory capability, with each cell 102-105 providing charge storage for both. Storing data into the volatile memory of cells 102-105 is performed using WRITE operations. Reading data from volatile memory of cells 102-105 is performed with READ operations. Storing data into the non-volatile memory of cells 102-105 is performed using STORE (e.g. FLASH WRITE) operations. STORE operations may be preceded by a nonvolatile ERASE (e.g. FLASH ERASE), which clears any stored nonvolatile bit. Reading data from the non-volatile memory of cells 102-105 is performed with RECALL operations.

In FIG. 1, two nvDRAM bit cells 102 and 103 have been associated with BT0 and BC0. Two nvDRAM bit cells 104 and 105 have been associated with BT1 and BC1. Word line WL0 has two cells 103 and 105 associated with it. Word line WL1 has two cells 102 and 104 associated with it. Of course, these are merely examples for the purpose of illustration, and in practice many more cells may be associated with particular word lines and bit lines.

Figure 2:
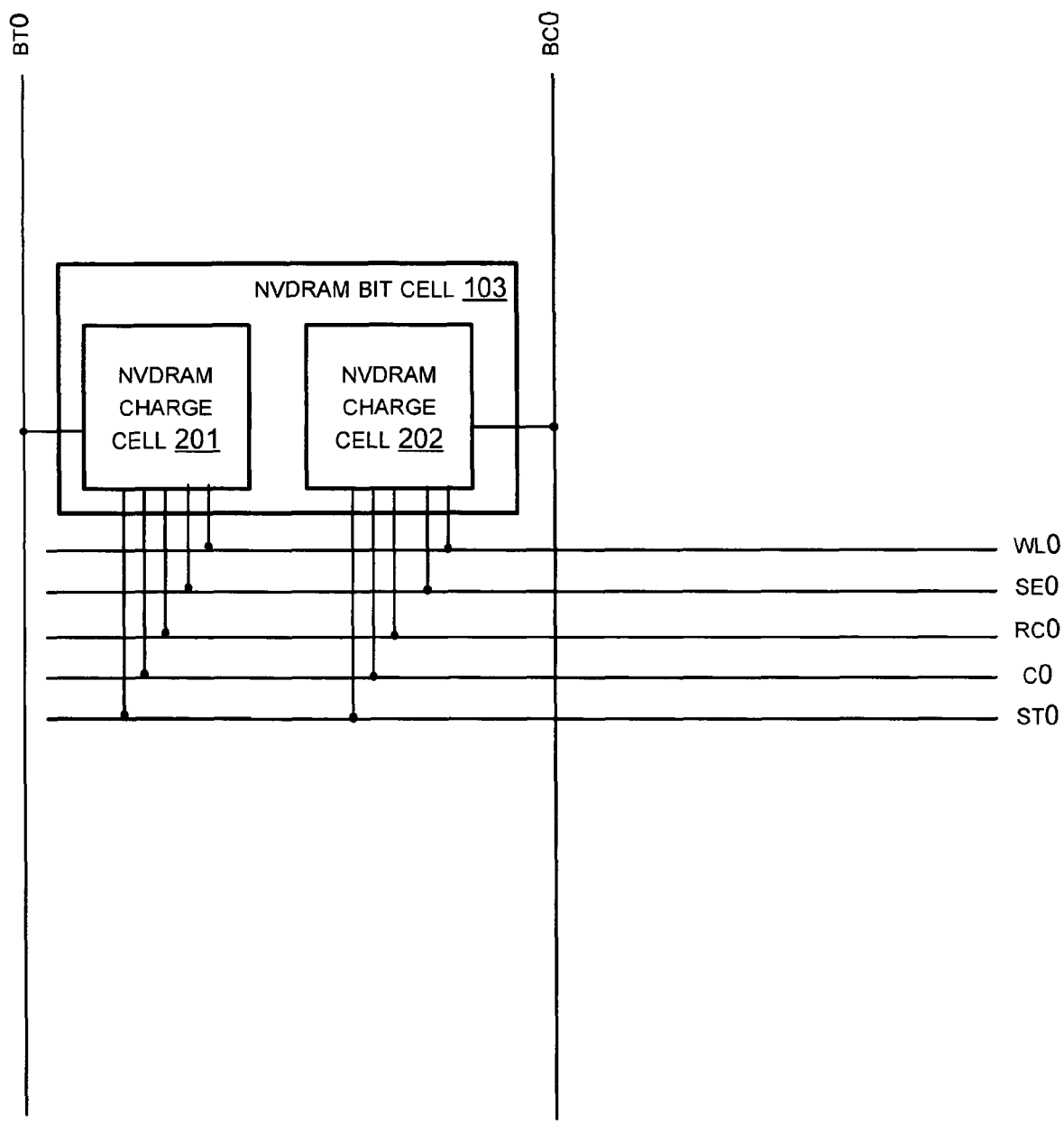
FIG. 2 is a block diagram of an embodiment of a combined volatile nonvolatile bit cell in more detail.

FIG. 2 is a block diagram of an embodiment of a combined volatile nonvolatile bit cell in more detail. The bit cell 103 comprises two charge cells 201 and 202. One charge cell 201 is coupled to bit line BT0. The second charge cell is coupled to compliment line BC0. When BT0 is used to write a one (e.g. high state) into charge cell 201, BC0 may simultaneously be used to write the logical compliment, a zero, into charge cell 202, and visa versa.

The word line WL0 and the signals SE0, RC0, C0, and ST0 are each coupled to the two charge cells 201 and 202.

Figure 3:
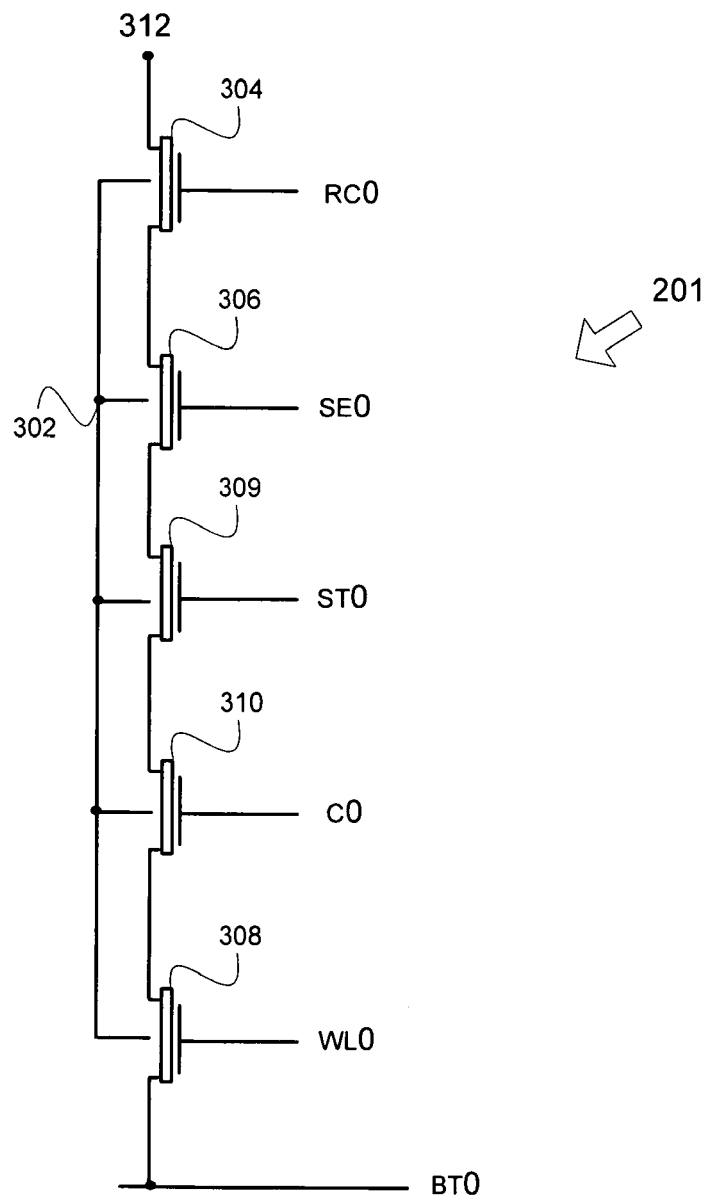
FIG. 3 is an illustration of an embodiment of a combined volatile nonvolatile charge cell.

FIG. 3 is an illustration of an embodiment of a combined volatile nonvolatile charge cell. The charge cell will typically be paired with a complement charge cell (see FIGS. 1 and 2) to form a memory cell. The charge cell 201 and the complement cell have similar topologies and signaling regimes, thus, a description of the structure and signaling of only one charge cell of a pair will be described here. The charge cell 201 comprises five transistors 304, 306, and 308, 309 and 310. Transistors 304 and 308 act as isolation transistors, isolating internal components of the charge cell 201 from the bit line BT0 and from currents/voltages at 312, respectively. Transistor 306 stores information representing the non-volatile bit stored by the cell 201 and may, in some embodiments, also store information representing the volatile bit stored by the cell 201. In some embodiments transistors 309 and 310 can also play a role in storing the volatile bit. The transistor 306 may be a SONOS (silicon oxide nitride oxide semiconductor) device. Transistor 309 can be a medium voltage MOS transistor and transistor 310 a low voltage transistor.

Embodiments comprising SONOS transistors are described herein. It should be appreciated that other types of nonvolatile storage elements may be employed, such as silicon nitride oxide semiconductor (SNOS) transistors, floating gate transistors, ferroelectric transistors, and capacitors, to name a few.

The arrangement of FIG. 3 may involve fewer transistors and thus less expense and higher densities than prior solutions, such as nvSRAM. The charge cell 201 comprises a node 302, also known as "bulk", which may be tied to a constant logical low, also known as Vss or ground.

Charge cell 201 comprises node 312 which may be set low during volatile operations (e.g. READ and WRITE). Signal 312 may be driven high for RECALL, to act as a source of current driven onto the bit line BT0. In some embodiments, 312 may be driven high during STORE as well, in order to reduce leakage current that may otherwise be generated by the higher voltages associated with certain nonvolatile operations (higher than for volatile operations).

The bit line BT0 is coupled to transistor 308. Transistor 308 acts to couple to the bit line BT0 to internal structures of the charge cell 201 during volatile and nonvolatile operation. Transistor 308 is turned on and off using the word line signal WL0.

Charge cell 201 comprises a signal line RC0 to the gate of isolation transistor 304. Signal RC0 may be asserted during RECALL to couple current source 312 to the internals of the cell 201.

Signal line SE0 is coupled to the gate of transistor 306. Signal SE0 may be asserted during nonvolatile STORE to store information representing a nonvolatile bit using transistor 306. Transistor 306 stores the non-volatile information as well as the volatile information. Signal SE0 may also be asserted with a larger (larger in magnitude than logical high) negative voltage during ERASE to set any nonvolatile bit information stored by transistor 306 to a known state. (For example, an ERASE may set the transistor 306 state similar to the state it would have when representing a logical nonvolatile 'one'—see the description of RECALL for more details).

Two other signals, ST0 and C0, are provided to transistors 309 and 310, respectively. The use of these signals will be described in conjunction with the description of volatile and nonvolatile memory operations, below.

Figure 4:
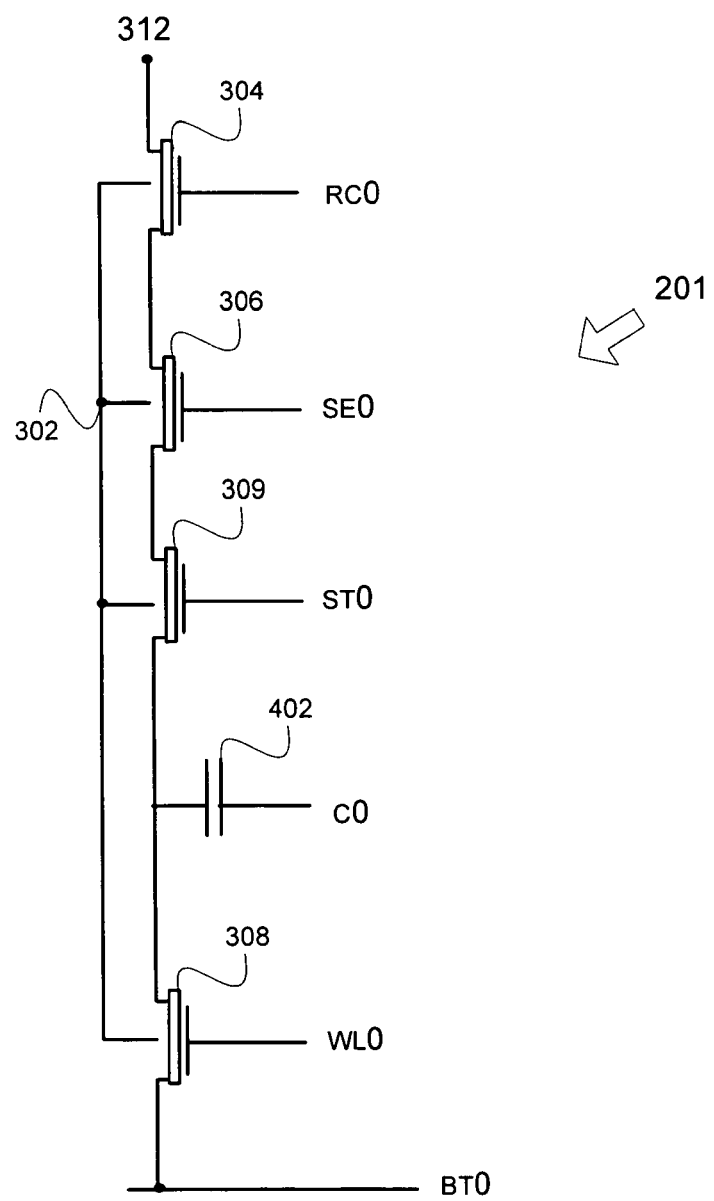
FIG. 4 is an illustration of another embodiment of a combined volatile nonvolatile charge cell.

FIG. 4 is an illustration of an embodiment of a combined volatile nonvolatile charge cell. It is similar in most respects to the structure of FIG. 3, except that a storage capacitor 402 is employed in place of transistor 309 to provide or assist with providing volatile bit charge storage.

Figure 5:
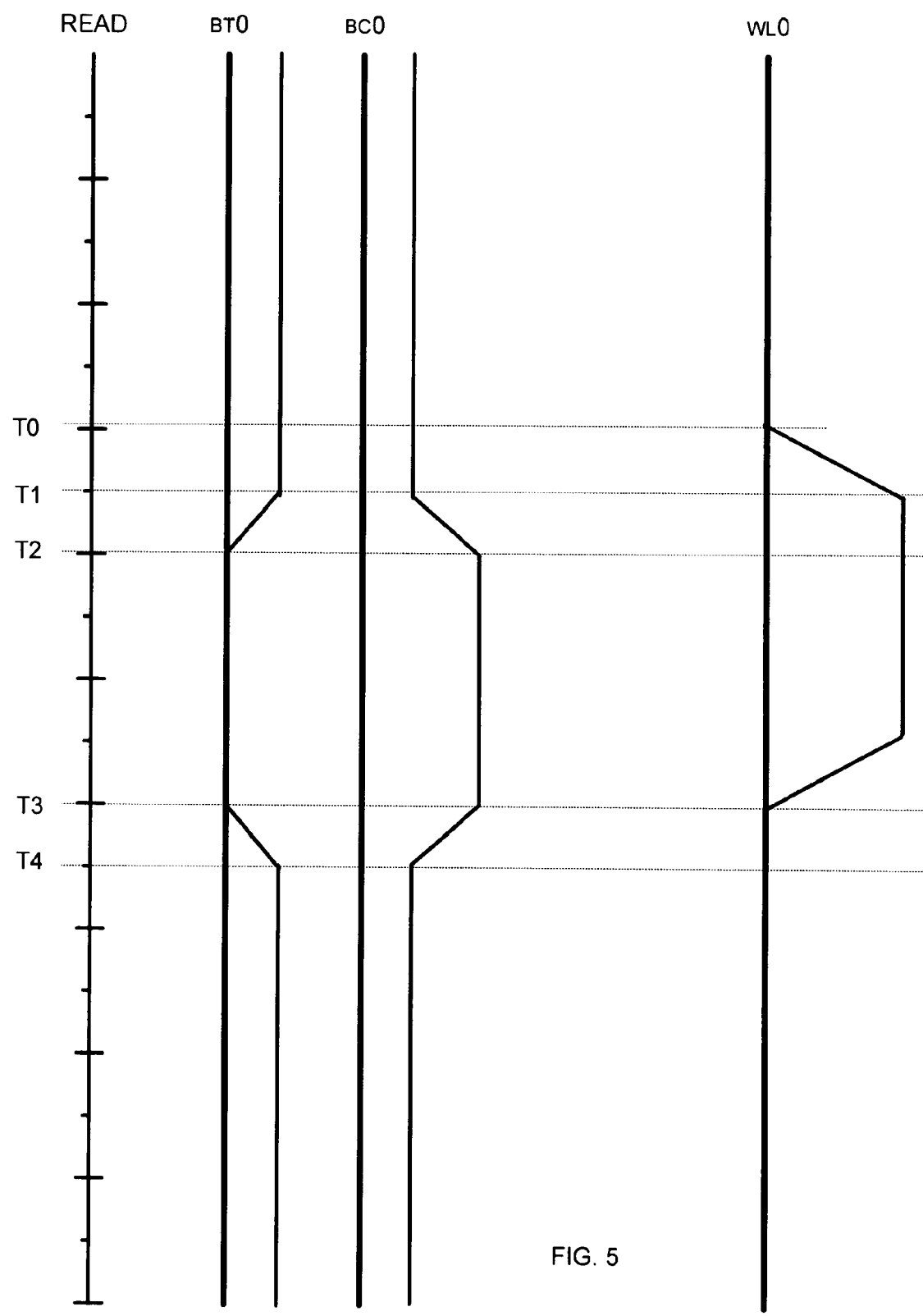
FIG. 5 is a time line diagram of an embodiment of a volatile READ operation.
Figure 6:
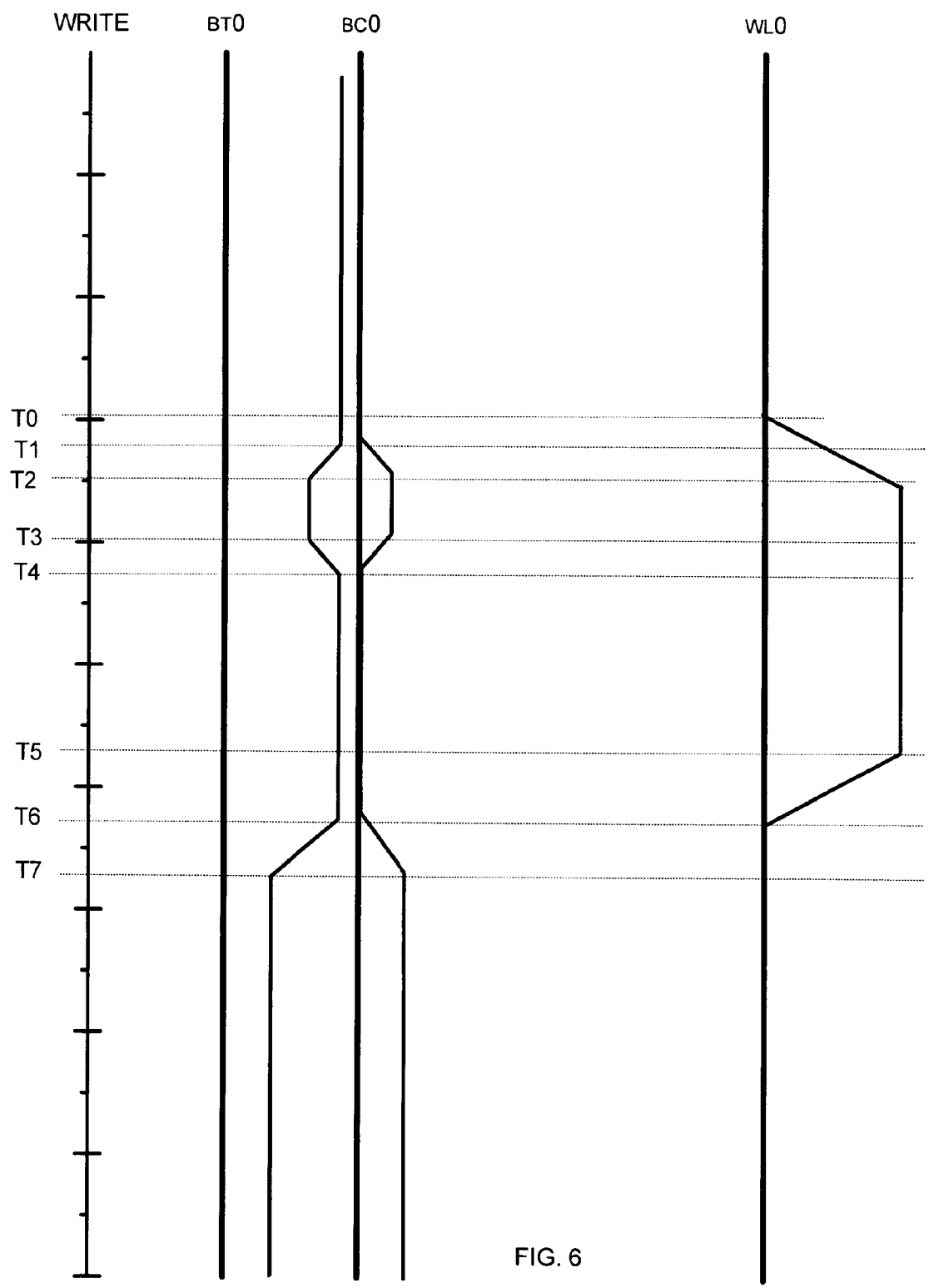
FIG. 6 is a time line diagram of an embodiment of a volatile WRITE operation.
Figure 7:
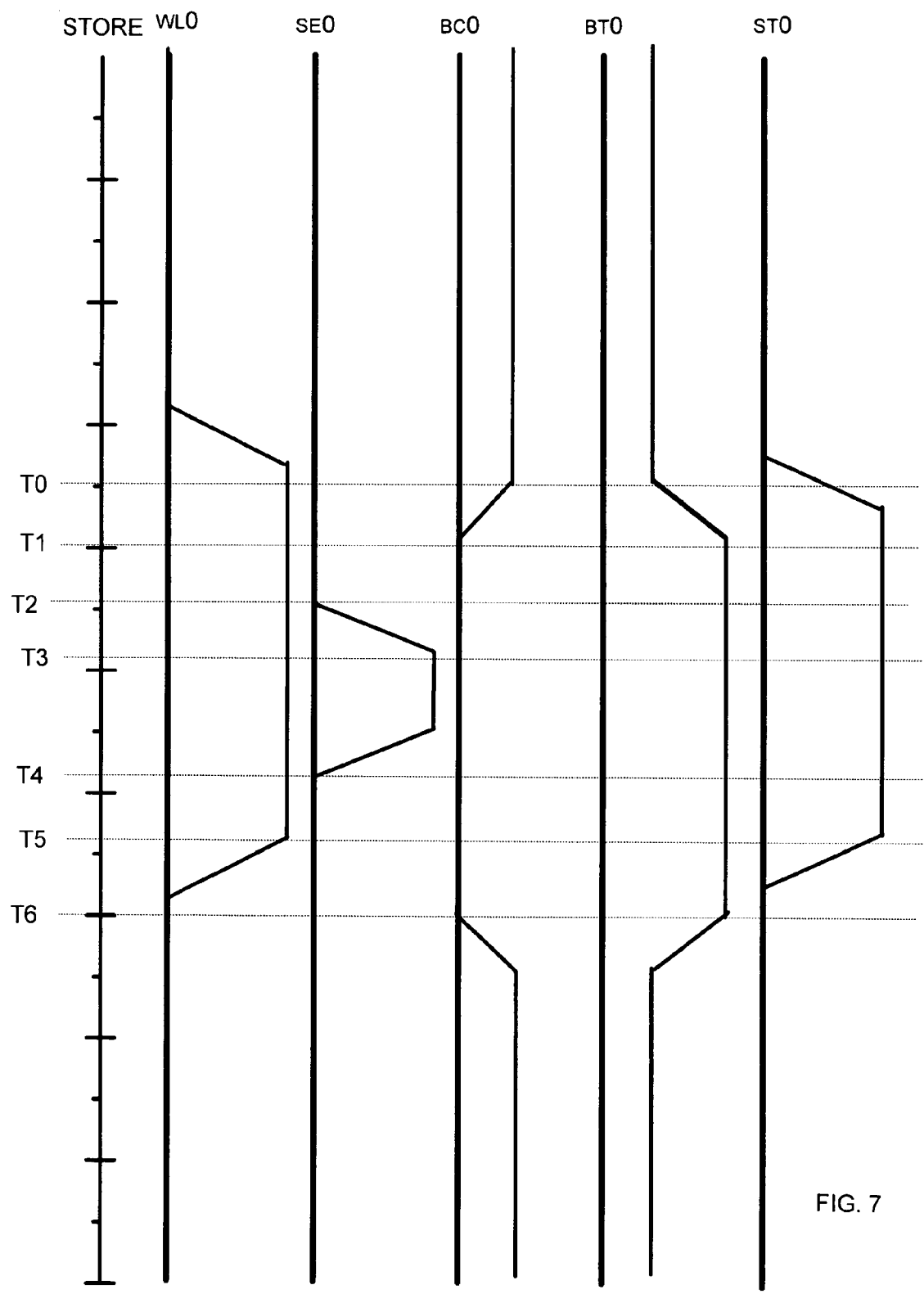
FIG. 7 is a time line diagram of an embodiment of a nonvolatile STORE operation.
Figure 8:
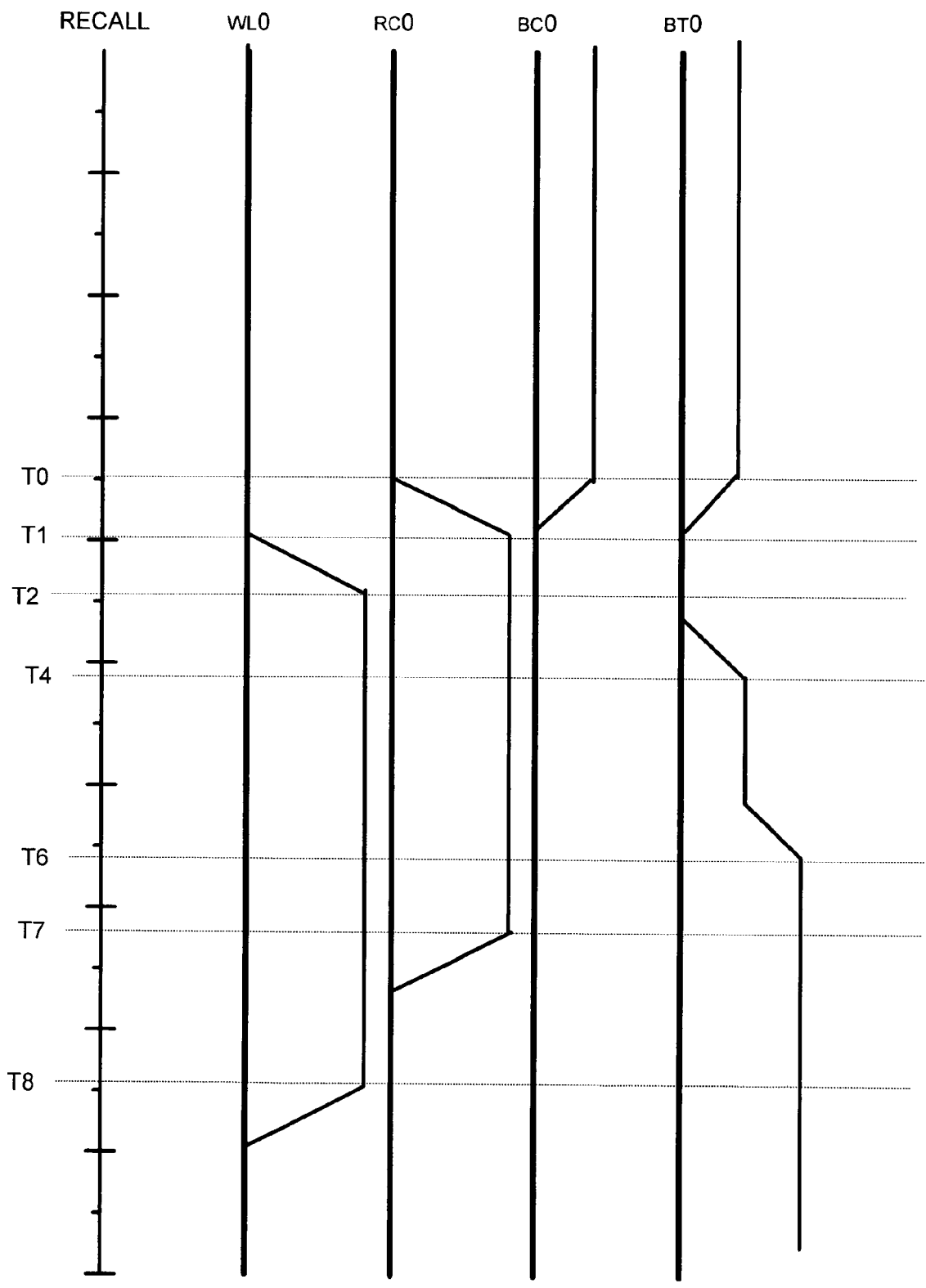
FIG. 8 is a time line diagram of an embodiment of a nonvolatile RECALL operation.
Figure 9:
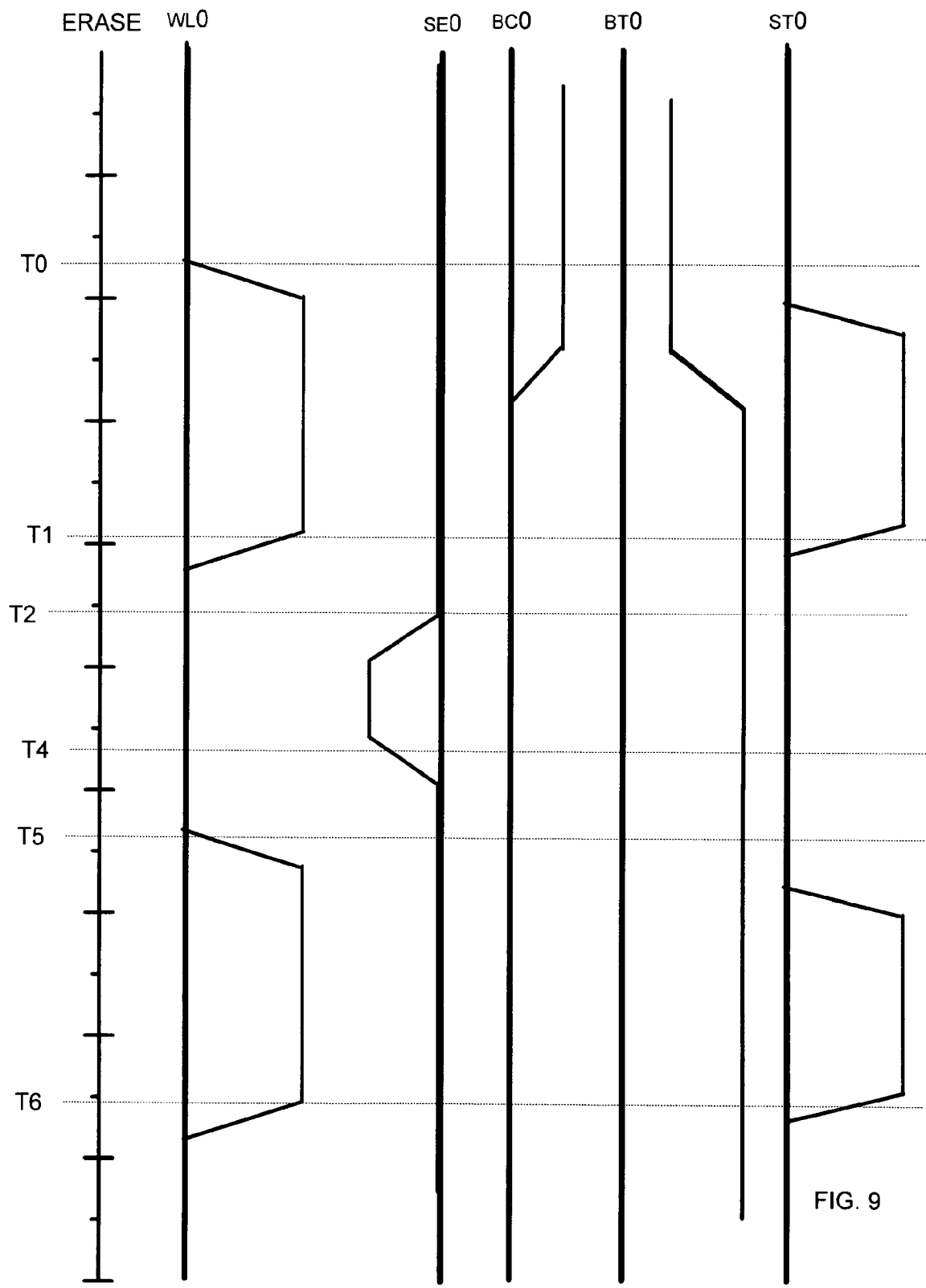
FIG. 9 is a time line diagram of an embodiment of a nonvolatile ERASE operation.

FIGS. 5-9 are time line illustrations showing embodiments of signaling for various volatile and nonvolatile operations. FIG. 5 is a time line diagram of an embodiment of a volatile READ operation. FIG. 6 is a time line diagram of an embodiment of a volatile WRITE operation. FIG. 7 is a time line diagram of an embodiment of a nonvolatile STORE operation. FIG. 8 is a time line diagram of an embodiment of a nonvolatile RECALL operation. FIG. 9 is a time line diagram of an embodiment of a nonvolatile ERASE operation.

Memory operations are described for both the structure of FIG. 3 and the structure of FIG. 4. For each structure, two modes (signaling schemes) of operating the structures shall be described.

The following memory operation descriptions refer to a single charge cell of the charge cell pair. In general, operations of one charge cell will likewise be carried out for the paired charge cell, which stores charges representing complement values of the volatile and nonvolatile bits of the charge cell with which it is paired.

Volatile READ

Referring to FIG. 5 in conjunction with FIGS. 3 and 4, two modes of operating each structure for volatile READ will be described. Those skilled in the art will recognize that variations of the structures and/or modes of operating the structures may be made accordingly.

A first mode of operating the structures of FIGS. 3 and 4 for volatile READ operations involves storing the volatile bit charge ("v-bit") using capacitive effects of transistor 310. This mode may be referred to as "operational mode 1". During READ in operational mode 1, transistor 309 is turned off (e.g. ST0 low), effectively isolating the low voltage region (LV, transistors 310 and 308) from the high voltage region (HV, transistor 304, 306) of the cell.

The term "high voltage region" refers to regions of the cell that may be exposed to voltages above logical "one", e.g. voltages such as +/−Vprog or in the vicinity of +/−Vprog/2 to perform nonvolatile STORE and ERASE functions.

READ may be accomplished in operational mode 1 by signals C0 and WL0 to transistors 310 and 308 of the LV region. Signals to the HV region (RC0, the voltage at node 312, SE0) may be zero (low) during READ because in mode 1 the HV region is not involved in volatile charge storage. Initially, WL0 is low, and thus transistor 308 is off, isolating the cell 201 from the bit line BT0.

To begin the READ, the bit line BT0 may be pre-charged, in some embodiments to a level around halfway between high and low, or Vcc/2 (T0). For the structure of FIG. 3, charge (or lack thereof) representing the volatile bit is stored by capacitive effects of transistor 310 (henceforth, the "v-bit" charge storage). The v-bit charge is typically highly mobile. In some embodiments, transistor 310 is a depletion transistor, so that charge mobility may be accomplished by setting C0 low or even negative. In other embodiments transistor 310 is an enhancement transistor, thus C0 may be set to a positive voltage to achieve charge mobility.

For the structure of FIG. 4, v-bit charge storage is provided either partially or fully by the plates of capacitor 402.

For either structure, when the stored volatile bit is a one, the v-bit storage comprises a charge (or lack thereof) that is representative of a logical one, or high. When WL0 to transistor 308 is asserted, charge flows between BT0 and the v-bit storage, moving the voltage level of BT0 higher or at least not moving the bit line voltage down. The sense amplifier engages and drives BT0 to a logical one.

When the stored volatile bit is a zero, the v-bit storage comprises no significant charge which is comparable to a logical zero, or low. This is the situation expressed in FIG. 5. When WL0 is asserted, charge flows from BT0 to the v-bit storage. This pulls down the voltage on BT0 by a small amount. The sense amplifier engages and drives BT0 to logical zero, or low (T1-T2).

After the volatile bit is sensed, the voltage on BT0 will determine the setting of v-bit. If BT0 is zero, v-bit remains uncharged and a zero volatile bit is stored when WL0 is dropped (T2-T3). If BT0 is one, v-bit is recharged and a one volatile bit is stored when WL0 is dropped. In other words, v-bit is "refreshed" after the READ operation. As previously indicated, during READ similar operations (but for opposite volatile bit values) occur for the complement charge cell and complement bit line, BC0, enabling the sense amplifier to detect differential voltages on BT0 and BC0. After a READ, the bit lines may be reset to pre-charge levels (T4).

Bit line voltage sensing during volatile READ operations may be based upon small differential voltages on the bit line and complement bit line. This may differ in some embodiments from bit line sensing during nonvolatile RECALL operations, which may be based more upon detecting current flows (or using significant current flows from the memory cells to the bit lines to charge the bit lines from low levels) than on detecting small voltage differentials.

READ operational mode 2 is similar to mode 1, except that v-bit storage is more widely distributed among the transistors. In particular, v-bit storage may be achieved using capacitive effects of transistor 310 (or capacitor 402) of the LV region, as well as capacitive effects of isolation transistor 309 and/or transistor 306, which is in the HV region and also provides for nonvolatile bit (nv-bit) charge storage.

To extend charge storage to additional transistor regions in mode 2, one or both of signals ST0 and SE0 to transistors 309 and 306 may be asserted during READ in order to create charge mobility in the channels of those transistors. During the READ, SE0 may be set high or to some comparable value to facilitate charge migration to and from v-bit.

Volatile WRITE

Referring to FIG. 6 in conjunction with FIGS. 3 and 4, two modes of operating each structure for volatile WRITE will be described. Those skilled in the art will recognize that variations of the structures and/or modes of operating the structures may be made accordingly.

During WRITE in operational mode 1, transistor 309 is turned off (e.g. ST0 low), effectively isolating the LV region from the HV region of the cell.

WRITE may be accomplished in operational mode 1 by signals C0 (for example as described for READ) and WL0 to transistors 310 and 308 of the LV region. Signals to the HV region (RC0, the voltage at node 312, SE0) may be zero (low) during WRITE because in mode 1 the HV region is not involved in volatile charge storage. Initially, WL0 is low, and thus transistor 308 is off, isolating the cell 201 from the bit line BT0.

As previously indicated, during WRITE similar operations (but for opposite volatile bit values) occur for the complement charge cell and complement bit line, BC0, enabling the sense amplifier to detect differential voltages on BT0 and BC0.

When writing a one to v-bit, BT0 is set to 'one', or logical high. This is the situation expressed in FIG. 6. WL0 is then set high (T0-T2). If there is no charge in v-bit storage (a previously stored volatile bit of zero), charge flows from BT0 to v-bit storage. WL0 is brought low and a one is thus stored in v-bit storage. Transient effects may be seen on the bit line and complement bit line during the migration of charge (T1-T4).

See the description of volatile READ for a description of v-bit charge storage in operational mode 1 for the structures of FIGS. 3 and 4.

WL0 may drop and the bit line and complement line may be reset to pre-charge levels (T5-T7).

When writing a zero to the volatile bit, BT0 is set to zero, or low. WL0 is set high. If there is a charge in v-bit storage (a previously stored volatile bit of one), charge drains from v-bit storage to BT0. WL0 is brought low and a zero is thus stored in v-bit storage.

To extend volatile charge storage to additional transistor regions in mode 2, one or both of signals ST0 and SE0 to transistors 309 and 306 may be asserted during WRITE in order to create charge mobility in the channels of those transistors.

Non-Volatile STORE

Referring to FIG. 7 in conjunction with FIGS. 3 and 4, two modes of operating each structure for nonvolatile STORE will be described. As previously indicated, during STORE similar operations (but for opposite volatile bit values) occur for the complement charge cell and complement bit line, BC0, enabling the sense amplifier to detect differential voltages on BT0 and BC0.

Those skilled in the art will recognize that variations of the structures and/or modes of operating the structures may be made accordingly.

In mode 1, STORE operation may be accomplished by first READing the v-bit charge to the bit line BT0 (T0-T1) (see the description of volatile READ), and asserting ST0 to turn transistor 309 on. This enables charge to migrate from the bit line BT0 to the HV region where nv-bit is stored.

SE0 is then asserted to a "program" level Vprog (T2-T4). In some embodiments Vprog may be higher than the voltage representing a logical one bit. For example, when 306 is a SONOS transistor, Vprog may be approximately +10V.

Asserting Vprog causes the storage of the value of v-bit to nv-bit of transistor 306. If no charge is stored in v-bit, meaning the volatile bit is zero, the sense amplifier will hold BT0 and thus the source of transistor 306 low (e.g. 0V), and charge will flow to the SONOS gate traps. If charge is stored in v-bit, meaning the volatile bit is logical one, the source of transistor 306 is held high by the sense amplifier, and by capacitive coupling the source voltage of 306 to a high voltage state with no significant voltage difference between the channel and gate of transistor 306, consequently a nonvolatile 'one' bit, which is equal to an ERASE state, is stored. STORE of the complement o-bit to complement nv-bit works in substantially the same way. The situation expressed in FIG. 7 reflects storage of a 'one' bit.

When WL0 is asserted, the sense amplifier will engage to pull the bit line BT0 to a one or zero, depending on whether v-bit stored a one or zero, respectively (T0-T1). See the discussion of volatile READ for more details.

After the nonvolatile bit is stored, the voltage on BT0 will determine the setting of v-bit. If BT0 is zero, v-bit remains uncharged and a zero volatile bit is stored when WL0 is dropped. If BT0 is one, v-bit is recharged and a one volatile bit is stored when WL0 is dropped. In other words, v-bit is "refreshed" after the STORE operation.

A STORE will not overwrite an nv-bit of one with a v-bit of zero. Thus nv-bit (and complement nv-bit) may be cleared (erased) prior to performing a STORE, in order to ensure that during STORE nv-bit either remains a zero (if v-bit is a zero) or is flipped to a one if v-bit is one.

In some embodiments the node 312 may be set high (e.g. logical one) during STORE. The STORE still proceeds as described above, however leakage current across transistor 304 may be reduced.

To extend charge storage to additional transistor regions in mode 2, one or both of signals ST0 and SE0 to transistors 309 and 306 may be asserted to logical high during STORE in order to create charge mobility in the channels of those transistors. The signal SE0 may be set to logical high to create charge mobility in the channel of 306, then further raised to Vprog to cause charge storage of v-bit to nv-bit in the same way as in operational mode 1.

Non-Volatile ERASE

Referring to FIG. 9 in conjunction with FIGS. 3 and 4, two modes of operating each structure for nonvolatile ERASE will be described. Those skilled in the art will recognize that variations of the structures and/or modes of operating the structures may be made accordingly.

An ERASE may set nv-bit and complement nv-bit to a known state (for example, to logical one). In some embodiments, to effect an ERASE, SE0 may be set to a relatively high negative value-Vprog, such as (for 306 SONOS) −10V (T2-T4).

In mode 1, there is no v-bit charge storage in the HV region, which remains isolated from the LV region due to transistor 309 remaining off. Thus in mode 1, SE0 is simply set to −Vprog to clear nv-bit.

In mode 2, v-bit charge storage is more broadly dispersed across transistors 306, 309, and 310 (or capacitor 402). Thus ERASE may affect the value of v-bit, particularly in transistor 306, which also stores nv-bit. Thus in mode 2, a READ of v-bit to BT0 (T0-T1) may precede the ERASE, and a WRITE from BT0 to v-bit (T5-T6) may follow ERASE. This may act to prevent changes to v-bit as a result of ERASE. In other words, v-bit is "refreshed" after the ERASE operation. It also restores nv-bit and complement nv-bit to complement values.

Non-Volatile RECALL

Referring to FIG. 8 in conjunction with FIGS. 3 and 4, two modes of operating each structure for nonvolatile RECALL will be described. Those skilled in the art will recognize that variations of the structures and/or modes of operating the structures may be made accordingly.

In both modes, a RECALL operation may be accomplished by first causing nv-bit to be represented on BT0 (nvREAD, T0-T6), then performing a WRITE to store the nv-bit value in v-bit.

To perform an nvREAD, RC0 and the voltage at node 312 are both set high (e.g. Vcc) (T0-T7). Setting RC0 high turns on transistor 304. ST0 and WL0 are also set high (T1-T8), turning transistors 309 and 308 on. BT0 and SE0 may be set low (T0-T1). Setting SE0 low will result in the channel of transistor 306 to switch "off", unless the stored value of nv-bit is "one", in which case 306 will remain "on" or at least allow some current to pass through from source to drain.

If nv-bit stores a 'one', the transistor 306 will pass current between 312 and BT0. BT0 will be pulled toward a high value (T2-T4), and the sense amplifier will engage to drive BT0 fully to 'one' (T4-T6). Otherwise, if nv-bit stores a zero, transistor 306 will not pass current between 312 and BT0. BT0 will remain low. In either case, the sensed value of BT0 will represent the stored value of nv-bit.

In both modes, bit line voltage sensing during nonvolatile RECALL operations may be based upon sensing current flows, or upon using current flow from 312 to charge the bit line BT0. This may differ in some embodiments from bit line sensing during volatile READ operations, which may be based more upon detecting small voltage differentials than on sensing current flows.

In both modes, a WRITE may then be performed to store the value of BT0 to v-bit (see FIG. 6).

In some embodiments, the transistors 304 and 308 (which may be conventional CMOS) may be fabricated with different gate-oxide thicknesses from one another, to better suit the different voltage conditions applied to these transistors during nonvolatile operations. Thinner gate oxide layers in these transistors may improve the performance of RECALL operations.

Figure 10:
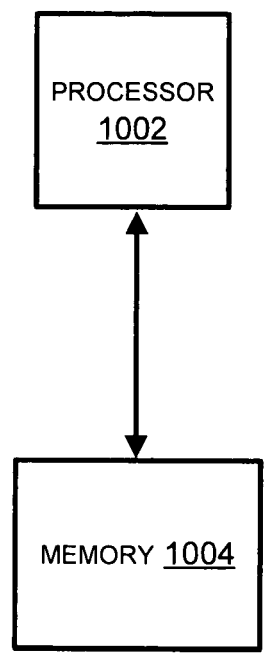
FIG. 10 is a block diagram of an embodiment of a device system including a combined volatile nonvolatile memory.

FIG. 10 is a block diagram of an embodiment of a device system including a combined volatile nonvolatile memory. The device will typically comprise at least one processor 1002, for example a general purpose microprocessor, an embedded special-purpose processor, a digital signal processor, and so on. The processor 1002 may interact with a memory 1004 to read and write data during system operation. The memory 1004 may comprise a combined volatile nonvolatile array of cells, in accordance with the structures and techniques described herein. In the course of operation, or upon imminent loss of system power, data may be stored from volatile regions of the memory 1004 to the nonvolatile regions.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is

1. A memory circuit, comprising:
   a non-volatile bit storage region ("nv region") configured to store a non-volatile bit value;
   a volatile bit storage region ("v region") configured to store at least part of a volatile bit value;
   a control circuit to control voltage levels applied to the nv region and the v region during memory operations;
   an isolation circuit configured to selectively create or remove electrical isolation between the v region and the nv region when operated by the control circuit;
   the control circuit configured to perform a STORE memory operation by:
     operating the isolation region to remove electrical isolation between the nv region and the v region;
     setting the non-volatile bit value to the volatile bit value; and
     after the non-volatile bit value is stored, refreshing the volatile bit value to the value it had before the non-volatile bit value was set.

2. The memory circuit of claim 1, further comprising:
   the control circuit configured to apply voltages of greater magnitude than logical one to a charge storage element of the nv region during the STORE.

3. The memory circuit of claim 1, further comprising:
   the control circuit configured to preserve the value of the volatile bit on a bit line; and
   the control circuit configured to set the volatile bit value from the bit line to the v region after the non-volatile bit value is stored.

4. The memory circuit of claim 3, further comprising:
   the control circuit configured to remove isolation between the nv region and the v region until the volatile bit value in the v region is set from the bit line.

5. The memory circuit of claim 1, further comprising:
   the volatile bit value stored by one or more transistors that also store the non-volatile bit value.

6. The memory circuit of claim 5, further comprising:
   the nv region comprising a single SONOS transistor that stores the non-volatile bit value and a portion of the volatile bit value.

7. The memory circuit of claim 1, further comprising:
   the volatile bit value stored only by circuit elements that do not also store the non-volatile bit value.

8. The memory circuit of claim 1, further comprising:
   the nv region consisting of a single SONOS transistor.

9. The memory circuit of claim 7, further comprising:
   the v region comprising a single transistor.

10. The memory circuit of claim 1, further comprising:
    the volatile bit value stored exclusively by one or more elements of the v region and the isolation region.

11. The memory circuit of claim 1, further comprising:
    the nv region, isolation region, and v region together formed by five transistors configured to switch in series between a current supply terminal and a bit line.

12. The memory circuit of claim 1, further comprising:
    the v region comprising a capacitor configured in series between transistors of the isolation region.

13. The memory circuit of claim 1, further comprising:
    the v region and isolation region together consisting of three transistors in series.

14. A memory circuit, comprising:
a first region providing storage of a value of a nonvolatile bit;
a second region providing storage of at least part of a value of a volatile bit;
an isolation region configured to be operated to electrically isolate the first region from the second region;
a current source;
a control circuit configured to apply voltages to operate the first region, the second region, the isolation region, and the current source to perform a RECALL memory operation, by:
   removing electrical isolation between the first region and the second region;
   driving current from the current source through the first region and through the second region to a bit line when the value of the nonvolatile bit is a first value;
   preventing current from flowing through the first region and through the second region to a bit line when the value of the nonvolatile bit is a second value;
   setting the volatile bit value to a bit value on the bit line; and
   restoring electrical isolation between the first region and the second region.

15. The memory circuit of claim 14, further comprising:
sensing the bit value on the bit line as a current flow from the first region to the bit line.

16. The memory circuit of claim 14, further comprising:
the first value is a logical one, and the second value is a logical zero.

17. The memory circuit of claim 14, further comprising:
the second region and isolation region together consisting of three transistors in series.

18. The memory circuit of claim 14, further comprising:
the value of the volatile bit stored by one or more transistors that also store the value of the non-volatile bit.

19. The memory circuit of claim 14, further comprising:
the first region consisting of a single SONOS transistor.

20. The memory circuit of claim 14, further comprising:
the value of the volatile bit stored by one or more transistors of the second region and the isolation region.

\* \* \* \* \*